United States Patent
Ueki et al.

(10) Patent No.: US 6,837,059 B2
(45) Date of Patent: Jan. 4, 2005

(54) TEMPERATURE ADJUSTMENT DEVICE AND LASER MODULE

(75) Inventors: Tatsuhiko Ueki, Tokyo (JP); Mamoru Shimada, Tokyo (JP); Yuji Hiratani, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/662,521

(22) Filed: Sep. 16, 2003

(65) Prior Publication Data

US 2004/0211190 A1 Oct. 28, 2004

(30) Foreign Application Priority Data

Sep. 17, 2002 (JP) ......................................... 2002-270501

(51) Int. Cl.[7] .............................................. F25B 21/02
(52) U.S. Cl. .......................................... 62/3.7; 62/259.2
(58) Field of Search ............................. 62/3.2, 3.3, 3.7, 62/259.2

(56) References Cited

U.S. PATENT DOCUMENTS

| | | | | |
|---|---|---|---|---|
| 5,848,210 A | * | 12/1998 | Kimura | 385/89 |
| 6,345,507 B1 | * | 2/2002 | Gillen | 62/3.7 |
| 6,499,306 B2 | * | 12/2002 | Gillen | 62/129 |
| 6,557,354 B1 | * | 5/2003 | Chu et al. | 62/3.2 |

* cited by examiner

*Primary Examiner*—Melvin Jones
(74) *Attorney, Agent, or Firm*—Oblon, Spivak, McClelland, Maier & Neustadt, P.C.

(57) ABSTRACT

A temperature adjustment device has a first thermoelectric cooling module, a second thermoelectric cooling module on which the first thermoelectric cooling module is provided, and a heat generating element which is provided on the first thermoelectric cooling module and a temperature thereof is adjusted, where assuming that a substrate area of the first thermoelectric cooling module on which the heat generating element is provided is $S1(mm^2)$ and that an amount of generated heat of the heat generating element is $Qd(mW)$, the relationship of $20 \leq Qd/S1 \leq 200$ is met.

10 Claims, 8 Drawing Sheets

| LD Heating value Q mW | Peltier substrate area S (mm²) | | | | | |
|---|---|---|---|---|---|---|
| | 2 | 4 | 8 | 16 | 32 | 64 |
| 150 | 75 | 37.5 | 18.75 | 9.375 | 4.6875 | 2.34375 |
| 250 | 125 | 62.5 | 31.25 | 15.625 | 7.8125 | 3.90625 |
| 360 | 180 | 90 | 45 | 22.5 | 11.25 | 5.625 |
| 600 | 300 | 150 | 75 | 37.5 | 18.75 | 9.375 |
| 800 | 400 | 200 | 100 | 50 | 25 | 12.5 |
| 1000 | 500 | 250 | 125 | 62.5 | 31.25 | 15.625 |

| | Symbol | Unit | Example | | | | | | Comparative Example | | | |
|---|---|---|---|---|---|---|---|---|---|---|---|---|
| | | | Config.A | Config.B | Config.C | Config.D | Config.E | Config.F | Config.G | Config.H | Config.I | Config.J |
| Ratio of element heating value to first substrate area | Qd/S1 | mW/mm^2 | 55.56 | 55.56 | 32.81 | 160.00 | 55.56 | 52.08 | 7.50 | 20.00 | 7.03 | 20.83 |
| Area ratio of first substrate to second subsutrate | S1/S2 | | 0.090 | 0.090 | 0.219 | 0.031 | 0.045 | 0.120 | 1.000 | 0.625 | 1.000 | 0.750 |
| Mode coefficient of TEC | F | mm | 9.07 | 9.52 | 24.30 | 9.22 | 4.54 | 12.10 | 25.79 | 29.65 | 36.11 | 49.41 |
| Area of first substrate | S1 | mm^2 | 6.48 | 6.48 | 18.40 | 2.25 | 3.24 | 8.64 | 48.00 | 30.00 | 64.00 | 48.00 |
| Sum of chip bottom area | Sc1 | mm^2 | 1.81 | 4.76 | 8.51 | 0.92 | 0.91 | 2.42 | 19.60 | 15.12 | 27.44 | 25.20 |
| Element heating value | Qd | mW | 360 | 360 | 600 | 360 | 180 | 450 | 360 | 600 | 450 | 1000 |
| Ratio of element heating value to sum of chip bottom area | Qd/Sc | mW/mm^2 | 198.41 | 75.66 | 70.55 | 390.63 | 198.41 | 186.01 | 18.37 | 39.68 | 16.40 | 39.68 |
| Power consumption (ambient temperature of 70°C/LD temperature of 0°C) | W | W | 2.50 | 2.50 | 4.00 | 2.10 | 2.00 | 3.50 | 5.00 | 5.50 | 5.50 | 9.00 |

TEMPERATURE ADJUSTMENT DEVICE AND LASER MODULE

BACKGROUND OF THE INVENTION

1. Field of the Invention

The present invention relates to a temperature adjustment device installed with a heat generating element, to a laser module, and more particularly, to a temperature adjustment device such as, for example, a thermoelectric element (peltier element) that requires temperature adjustment in a wide range such as a wavelength variable laser diode (LD), and to a laser module provided with the thermoelectric element.

2. Related Art

In a Dense Wavelength Division Multiplexing, required for a laser diode (LD) used as a signal light source are (i) high spectral purity and (ii) a wavelength of the light source which does not vary with ambient temperature, etc. Meanwhile, required for a laser diode (LD) used as a wavelength variable signal light source is enabling a wavelength of the light source to be varied in some range, as well as satisfying the above-mentioned conditions (i) and (ii). In order to achieve the above-mentioned condition (i), considered as a structure of LD are DFB (Distributed Feedback-Laser Diode), EBR-LD (Distribute-Bragg Reflector LD), etc. In order to achieve the above-mentioned condition (ii), various methods have been proposed, and a method is in practical use of controlling temperature of LD to control the wavelength.

Currently, in DWDM, a single printed circuit board installed with a single signal light source laser module and accompanying electric circuitry forms a signal light source of a single wave. In other words, DWDM of 256 waves is constructed of 256 printed circuit boards, and the printed circuit boards and accompanying electrical equipment is stored in a single cabinet. Power consumption of a single printed circuit board is about 20 W, a plurality of printed circuit boards and accompanying electrical equipment is stored in a small-sized cabinet, and therefore, the entire amount of generated heat is considerably large. Accordingly, inside the housing of the signal light source laser module is exposed to high temperature, and generally, operation reliability at ambient temperatures of 70° or more is required of the signal light source laser module.

Figure 11:
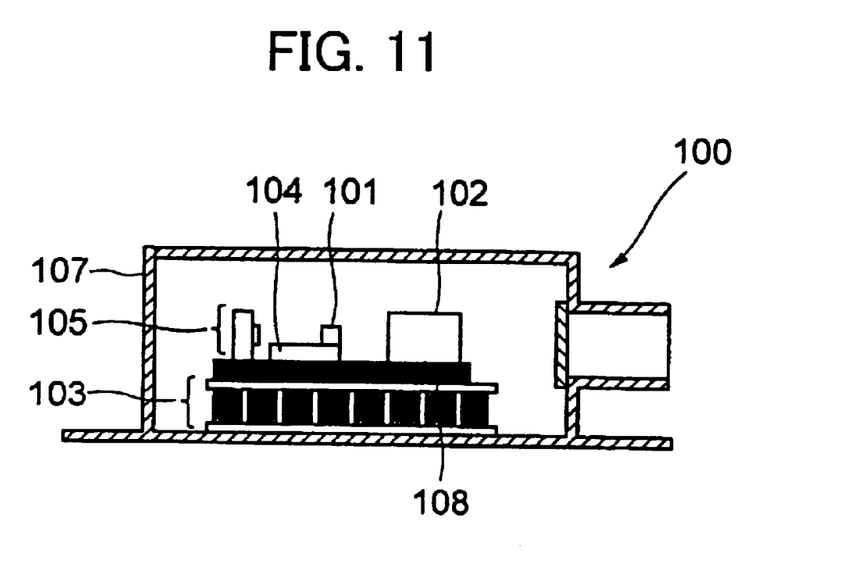
FIG. 11 is a cross sectional view of a convention signal light source laser module.

To clarify problems of the conventional signal light source laser module, following descriptions are given of a wavelength variable signal light source laser module under a condition with ambient temperature of 70° C. In the variable wavelength light source, in order to obtain a desired wavelength, a laser diode is disposed on a temperature adjustment device and the temperature is controlled. Generally, the temperature of the laser diode is controlled in a range of 50° C. to 0° C. As an example, a case will be described below where the temperature of LD is controlled to 0° C. . FIG. 11 is a cross sectional view of the conventional laser module.

In FIG. 11, it is assumed that the temperature inside the housing of the signal light source laser module is 70° C. , and that the temperature of the laser diode is 0° C. In the conventional signal light source laser module 100, in order to prevent an axis shift from occurring in an optical system 102 due to variations in temperature, a laser diode 101 and a laser carrier 104 are mounted on an upper plate of a thermoelectric cooling module 103 through a thermal conductive plate 108. In other words, when the temperature of the laser diode 101 is 0° C., the optical system 102 and laser carrier 104 are also cooled to 0° C. or around 0° C. Meanwhile, a spontaneous heat flow develops in a portion with low temperature cooled as described above from the housing 107.

The heat flow develops through gas molecules as media sealed in the laser module 100, radiation heat transfer and heat conduction via wire that supplies power to the laser diode. For example, in the housing with an inner area of 10 mm×20 mm×6 mm, the heat flow becomes about several hundred mW to 1 W. The thermoelectric cooling module needs power so as to transfer heat Q flowing to an upper substrate of the thermoelectric cooling module and heat of the laser diode to a high-temperature substrate of the thermoelectric cooling module. In addition, in the signal light source such as a variable wavelength light source, since about 20 mW is required as a light output, the amount of generated heat of the laser diode is 0.1 W at most.

Ideally, it is desired that the thermoelectric cooling module maintains the temperature of the laser diode at 0° C. by supply of power only for transferring the heat (0.1 W at most) of the laser diode. However, the module actually consumes much power because the module needs to transfer the generated heat of the laser diode and the heat Q flowing to a low-temperature portion from the housing which is several times the amount of generated heat.

Severe conditions are described above such that the temperature of the laser diode is 0° C. and the ambient temperature is 70° C. , but in many cases, the temperature of the laser diode is lower than the temperature of the housing under actual operation environments of the laser module. Therefore, the peltier element consumes power for transferring the heat that is not required originally, to some degree or another.

In order to suppress such power consumption, a laser diode package to restrict the transfer of the heat from a housing to a peltier module is disclosed in the Japanese Patent provisional publication JPH05-235489. According to the laser diode package as disclosed in JP H05-235489, the xenon gas is filled inside the package that accommodates therein a laser diode (LD) mounted on a thermoelectric cooling module (TEC). The xenon gas is inert and low in thermal conductivity, and inhibits the transfer of the heat except that of the laser diode to the thermoelectric module.

As described above, as the method of inhibiting transfer of heat from the housing to the peltier module, there is a method of filling a space inside the housing with a gas of low thermal conductivity. Used as the gas of low thermal conductivity are inert gases such as xenon and krypton. In this case, only replacing the gas to be sealed in the module with such a gas of low thermal conductivity reduces power consumption of the peltier element, and enables an airtightness (i.e., hermetic sealing) test of the housing to be carried out using a mass spectrometer. Further, when the gas is filled at a pressure of the atmospheric pressure or more, the airtightness test of the housing is not severer in this method than in an evacuation method as described below. However, the area of a portion of low temperature is still large in the thermoelectric cooling module and the inflow of the heat from the housing is also large. Further, inert gases such as xenon and krypton are very expensive, and it is difficult to provide the laser module products at inexpensive prices.

As another method of inhibiting transfer of heat from the housing to the thermoelectric cooling module, there is a method of evacuating a space inside the housing. The transfer of heat due to heat conduction of gas is eliminated, and therefore, it is possible to more reliably reduce power consumption than in the former method. However, this method requires the housing to have extremely severe airtightness and little gas emission quantity. In other words, in order for the above-mentioned structure to exhibit vacuum insulation effect, the pressure inside the housing is approximately one millionth or less of the atmospheric pressure. The heat insulation characteristics deteriorate gradually as the pressure increases, and the vacuum insulation effect disappears when the pressure is about one hundredth of the atmospheric pressure. In other words, the state becomes the same as described above where the heat transfer exists from the housing to the thermoelectric cooling module. Generally, reliability of about 25 years is required of a laser module as a signal light source. In order to maintain the pressure inside the housing to keep vacuum insulation for these years, an allowable leak amount in the housing is less than $10^{-12}$ Torrl/s.

The leak amount is detectable by using a quadrupole mass spectrometer only in the case where probe gas can be supplied to the laser module at substantially the atmospheric pressure. However, when the probe gas is actually filled in the housing, the vacuum insulation deteriorates, while a small amount of probe gas makes detection by a quadrupole mass spectrometer difficult. The same airtightness is required in producing a vacuum tube, but it is possible to perform detection of airtightness because the vacuum tube has the same structure as that of an ionization vacuum gauge. In the laser module, since the module is not provided with such a structure, detection of leak is remarkably difficult operation.

Vacuum insulation deteriorates not only when gas flows into the housing from air but also when gas absorbed or occluded inside the housing invades the vacuum. Such a state is called gas emission herein. It is difficult to limit gas emission to a low level, unless latest considerations are given from examination of materials of the housing and components accommodated inside the housing to degassing due to heating. Thus, vacuum insulation is effective in power consumption of the laser module, but not actual resolution, because some technical breakthroughs are necessary to provide a laser module with high reliability, low power consumption and inexpensive price.

SUMMARY OF THE INVENTION

The inventor of the present invention has continued dedicated studies to solve the conventional problem as described above. As a result, it is found out that the heat flow from a housing to a temperature adjustment device, for example, peltier module is caused by heat conduction through gas as a medium, and a quantity of heat transfer to the peltier module through gas as a medium is dependent on an area of a substrate of the peltier module mounted with a laser diode as a heat generating element. An area of the substrate is preferably small to decrease a quantity of heat flowing to the substrate from the housing through gas as a medium, while needing a size of some extent to absorb heating from the laser diode. Accordingly, it is found out that a temperature adjustment device can be provided that adjusts a heat generating element to predetermined temperature under severe ambient temperatures with low power consumption, by prescribing an area of a substrate so that an amount of generated heat per unit area of the heat generating element thermally joined to the substrate is within a predetermined range.

Further, in a structure where thermoelectric cooling modules are stacked in two stages or more, a second thermoelectric cooling module in a lower stage needs to absorb a sum of a heat absorbed by a substrate of a first thermoelectric cooling module in an upper stage on which a laser module is provided and a heat generated due to power consumed by the first thermoelectric cooling module to discharge outside the housing. It is found out that the heat that the second thermoelectric cooling module can discharge is dependent on a substrate area S2 of the second thermoelectric cooling module, and that it is possible to adjust the laser diode to predetermined temperature with a little power by prescribing a substrate area S1 of the first thermoelectric cooling module and the substrate area S2 of the second thermoelectric cooling module S2 so that a ratio of S1 to S2 is within a predetermined range.

The present invention was made based on results of the aforementioned studies, and a first aspect of the temperature adjustment device of the invention is a temperature adjustment device comprising:

a first thermoelectric cooling module;

a second thermoelectric cooling module on which the first thermoelectric cooling module is provided; and a heat generating element which is provided on the first thermoelectric cooling module and a temperature thereof is adjusted, wherein, $20 \leq Qd/S1 \leq 200$, where $S1(mm^2)$ is a substrate area of the first thermoelectric cooling module on which the heat generating element is provided, and $Qd(mW)$ is an amount of generated heat of the heat generating element.

A second aspect of the temperature adjustment device of the invention is a temperature adjustment device comprising:

a first thermoelectric cooling module;

a second thermoelectric cooling module on which the first thermoelectric cooling module is provided; and a heat generating element which is provided on the first thermoelectric cooling module and a temperature thereof is adjusted, wherein, $0.02 \leq S1/S2 \leq 0.25$ where $S1(mm^2)$ is a substrate area of the first thermoelectric cooling module on which the heat generating element is provided and $S2(mm^2)$ is a substrate area on the heat dissipating side of the second thermoelectric cooling module.

A third aspect of the temperature adjustment device of the invention is a temperature adjustment device wherein the first thermoelectric cooling module is comprised of a plurality of thermoelectric elements and substrates arranged so as to sandwich the thermoelectric elements via an electrode; and $5 \leq F \leq 25$, where F is a mode coefficient defined as Sc/h, $Sc(mm^2)$ is an area where the thermoelectric elements are joined to one of the substrates via the electrode, and $h(mm)$ is a height of the thermoelectric elements joining the substrates.

A fourth aspect of the temperature adjustment device of the invention is a temperature adjustment device wherein the amount of generated heat Qd of the heat generating element provided on the substrate is 50% or more of a heat flowing to the substrate of the first thermoelectric cooling module.

A first aspect of a laser module of the invention is a a laser module comprising:

a heat generating element;

the temperature adjustment device described above; and a sealed housing that contains the heat generating element and the temperature adjustment device, wherein the heat generating element is a laser diode.

Other aspect of the temperature adjustment device of the invention is the temperature adjustment device described above, wherein, $$40 \leq Qd/Sc1 \leq 500 \text{ (mW/mm}^2\text{)}$$

where Sc1 is a junction area of all the thermoelectric elements joined to the substrate of the first thermoelectric cooling module, and Qd is an amount of generated heat of the heat generating element.

DETAILED DESCRIPTION OF THE INVENTION

It is an object of the invention to provide a temperature adjustment device capable of adjusting a heat generating element to predetermined temperature in severe ambient temperatures with low power consumption and a laser module with low power consumption.

A heat generating element in the temperature adjustment device of the invention is an element generating heat by application of electric current, and for example, includes an optical device such as a laser diode, electronic device such as field-effect transistor (FET), and optical modulator using an electro-optic effect. Hereinafter, as an example, temperature adjustment is described using, as a heat generating element, a laser diode which is used as a signal light source of optical communications and on which the present invention has the effect most remarkably.

A first aspect of the temperature adjustment device of the invention is a temperature adjustment device which has a thermoelectric element, a first thermoelectric cooling module comprised of the thermoelectric element and substrates that are arranged opposite to each other to sandwich the thermoelectric element via an electrode, and a second thermoelectric cooling module on which the first thermoelectric cooling module is provided, and when it is assumed that a substrate area of the first thermoelectric cooling module on which the heat generating element is provided is $S1(\text{mm}^2)$ and that an amount of generated heat of the heat generating element is $Qd(\text{mW})$, meets the relationship of $20 \leq Qd/S1 \leq 200$.

Further, in the temperature adjustment device of the invention, when it is assumed that the substrate area of the first thermoelectric cooling module on which the heating module is provided is $S1(\text{mm}^2)$ and that a substrate area on the heat dissipating side of the second thermoelectric cooling module is $S2(\text{mm}^2)$, the relationship of $0.02 \leq S1/S2 \leq 0.25$ is met.

Furthermore, in the temperature adjustment device of the invention, the first thermoelectric cooling module is comprised of a plurality of thermoelectric elements and substrates arranged to sandwich the thermoelectric element via an electrode, and when it is assumed that an area where the thermoelectric elements are joined to one of the substrate via the electrode is $Sc(\text{mm}^2)$, and that a height of the thermoelectric elements joining the substrates is $h(\text{mm})$, a mode coefficient F defined as $Sc/h$ meets the relationship of $5 \leq F \leq 25$.

Moreover, in the relationship between the heat generating element and the first thermoelectric cooling module, the substrate area $S1$ of the first thermoelectric cooling module and an area $Sq$ of a portion of the heat generating element in contact with the substrate meet the relationship of $5 \times 10^{-3} < Sq/S \leq 1$.

The temperature adjustment device and laser module of the invention will be described below specifically with reference to accompanying drawings.

Figure 1:
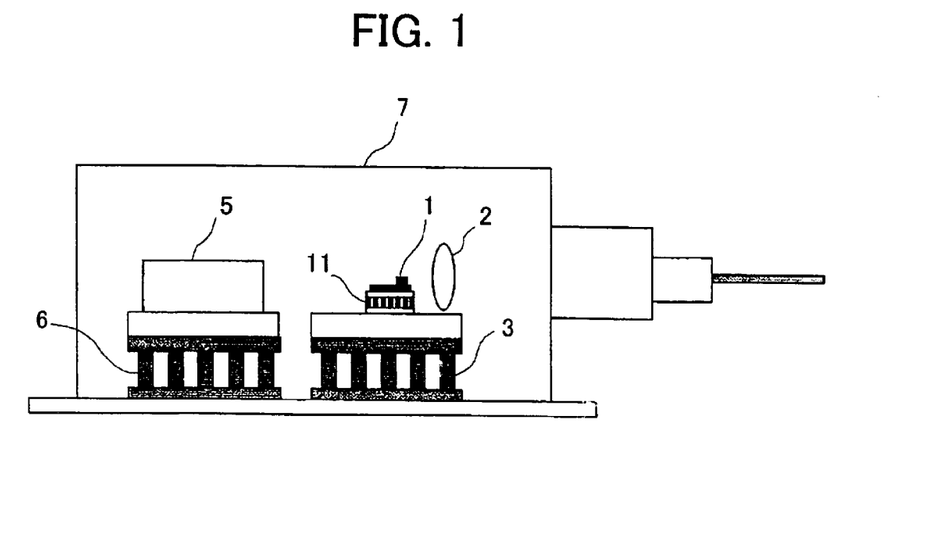
FIG. 1 is a view showing a schematic cross section of a laser module of the present invention.

FIG. 1 is a view showing a schematic cross section of the laser module of the invention. The laser module as shown in FIG. 1 is a signal light source laser module whose emission wavelength is controlled by controlling temperature of a laser diode. A laser diode 1 is provided with a structure called DFB (Distributed Feedback) LD or DBR (Distribute-Bragg Reflector) LD. The laser diode 1 is disposed on a substrate of a first thermoelectric cooling module 11 to undergo temperature control, and the first thermoelectric cooling module 11 is disposed on a second thermoelectric cooling module 3 having a substrate area larger than that of the module 11. A thermo-conductive substrate is provided between the first and second thermoelectric cooling modules, so that a heat released from the first thermoelectric cooling module 11 is diffused inside the substrate and conducted efficiently to a substrate of the second thermoelectric module 3.

Light emitted from the laser diode 1 to the right side as viewed in the figure is coupled to an optical system such as an optical fiber outside a housing 7. With respect to the light emitted to the left side as viewed in the figure, an optical detection series 5 detects a light intensity of the laser diode 1 and a light intensity with a predetermined wavelength passed through an optical wavelength filter, and thus detects a difference between the oscillation wavelength of the laser diode 1 and a desired wavelength.

Thus detected difference in wavelength of light is output from the optical detection series 5 as an electrical signal. Meanwhile, the oscillation wavelength of the laser diode 1 is dependent on temperature of the laser diode. Accordingly, the temperature adjustment device (i.e. the first thermoelectric cooling module 11 and second thermoelectric cooling module 3) that adjusts the temperature of the laser diode 1 is controlled by the electrical signal output from the optical detection series 5, and the laser diode 1 oscillates laser light with a desired wavelength.

The optical wavelength filter (for example, etalon) used in the optical detection series 5 changes optical characteristics when the temperature varies, and thus affects detection of laser oscillation wavelength. Therefore, the optical detection series 5 is disposed on the second thermoelectric cooling module 3 and undergoes temperature control.

In the foregoing, a fixed wavelength signal light source laser module and variable wavelength signal light source laser module are not distinguished from one another, and with respect to varying the temperature of the laser diode 1 using a control signal from the optical detection series 5, both laser modules are absolutely the same. However, a single wavelength is oscillated in the fixed wavelength light source laser module, while a wavelength needs to be varied in a range in the variable wavelength light source laser module. In other words, in the variable wavelength light source laser module, it is necessary to vary the temperature of the laser diode 1 in a wider range than in the fixed wavelength light source laser module.

The relationship between a substrate area of the first thermoelectric cooling module 11 and an amount of generated heat of a heat generating element will be described below using a wavelength variable laser module as an example. Generally, in the wavelength variable laser module, when the temperature of the module housing is 80° C., the temperature of the laser diode should be controlled in a range of 0° C. to 50° C. When the temperature of the laser diode is lower than the temperature of the housing, since heat is spontaneously transferred from the housing, etc. to the thermoelectric cooling module, in addition to heat from the laser diode, the thermoelectric cooling module performs extra works. According to analysis of the inventor of the present invention, the heat flow from the housing to the thermoelectric cooling module is caused by heat conduction through gas as a medium. Further, it is found out that a quantity of heat transfer through gas as a medium is dependent on a substrate area of the thermoelectric cooling module on which the laser diode is mounted. In other words, as the substrate area of the thermoelectric cooling module mounted with the laser diode is decreased, the heat transfer through gas as a medium is decreased.

Figure 2:
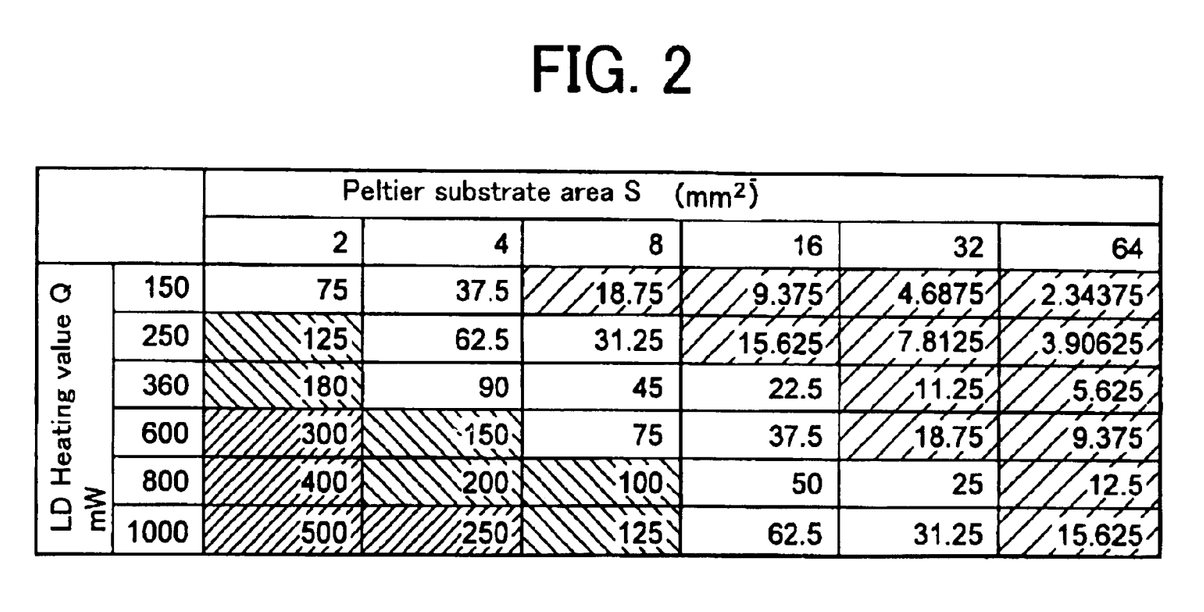
FIG. 2 is a table showing results of simulation with respect to a ratio of peltier substrate area S to an amount of generated heat Q of a laser module.

FIG. 2 is a table of simulation results in the case where the temperature of the housing is set at 70° C., and the temperature of the substrate of the first thermoelectric cooling module is set at 0° C., using a ratio of an area S1 of the substrate of the first thermoelectric cooling module to an amount of generated heat Qd of the laser diode stored in the housing. Numerals in the table indicate $Qd/S1(mW/mm^2)$. The upper limit of the amount of generated heat Qd of a heat generating element is 1000 mW, because the upper limit of the heat flowing from the housing to the thermoelectric cooling module is 1000 mW under dimensions of the laser module housing and usage condition that are almost current unified standards. In FIG. 2, a shaded region at a lower left portion in the table indicates a state where the amount of generated heat of the laser diode exceeds the heat absorption quantity of the thermoelectric cooling module substrate. In other words, in this region, power consumption is large. Further, in a region shown by oblique lines at the lower left portion, in addition to large power consumption, it tends to be impossible to control the temperature of the laser diode. Therefore, such a region should be avoided in design.

In a region shown by dotted lines at an upper right portion in the table, heat flow from the housing is increased as the substrate area increases. In other words, in this region, it is not impossible to control the temperature of the laser diode, but the peltier element consumes wasteful power, and thus the efficiency deteriorates. As is apparent from results shown in Table 2, when the amount of generated heat of the laser diode is assumed to be Qd(mW) and the substrate area $S1(mm^2)$ is within a range prescribed by $20 \leq Qd/S1 \leq 200$ $(mW/mm^2)$, it is possible to adjust the heat generating element to the predetermined temperature with low power consumption under severe ambient temperatures.

Thus, in the thermoelectric cooling module designed so that the amount of generated heat of the heat generating element is assumed to be Qd(mW) and the substrate area $S1(mm^2)$ is within a range prescribed by $20 \leq Qd/S1 \leq 200$ $(mW/mm^2)$, i.e. the amount of generated heat Qd of the heat generating element thermally coupled to the substrate is 50% or more of the total amount of generated heat flowing into the substrate, a half or more of the heat transferred by the thermoelectric cooling module is generated by the laser diode, and reduced power consumption is implemented. In other words, in the present invention, it is designed that the heat from the heat generating element is 50% or more of the total heat flowing to the thermoelectric cooling module, whereby it is possible to efficiently use the thermoelectric cooling module.

Further, assuming a total sum of the amount of generated heat caused by power consumption of the first thermoelectric cooling module and the amount of generated heat of the heat generating element which is disposed on the first thermoelectric cooling module and a temperature thereof is adjusted is Qd2(mW) and a substrate area of the second thermoelectric cooling module is $S2(mm^2)$, the present invention provides a temperature adjustment device meeting the relationship of $20 \leq Qd2/S2 \leq 200$.

The thermoelectric cooling module absorbs extra heat as its area is increased. Therefore, assuming that an area of a substrate of the thermoelectric cooling module on which the heat generating element is mounted is S1 and an area of a portion where the heat generating element and the thermoelectric cooling module is joined is Sq, reduction in power consumption as described above is achieved when $5 \times 10^{-3} < Sq/S \leq 1$.

In addition, although the heat generating element is limited to a laser diode in the foregoing, the same effectiveness by the present invention as described above is obtained by substituting an element that causes heating due to application of current for the laser diode. With respect to the LDM housing, substituting "housing" or "environment where the thermoelectric cooling module is disposed" obtains the same effectiveness by the present invention as described above.

Figure 3A:
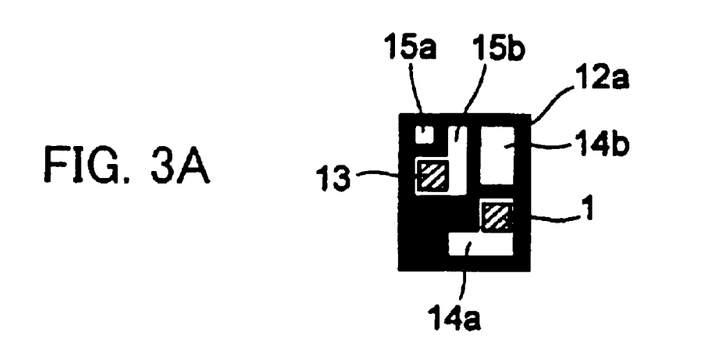
FIGS. 3A to 3C are views for illustrating a temperature adjustment device of the invention.
Figure 3B:
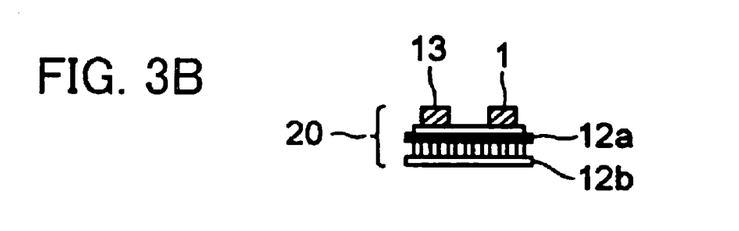

FIGS. 3A and 3B are to explain the first thermoelectric cooling module of the invention, and respectively show a plan view of the thermoelectric cooling module, and a front view of the thermoelectric cooling module.

Figure 3C:
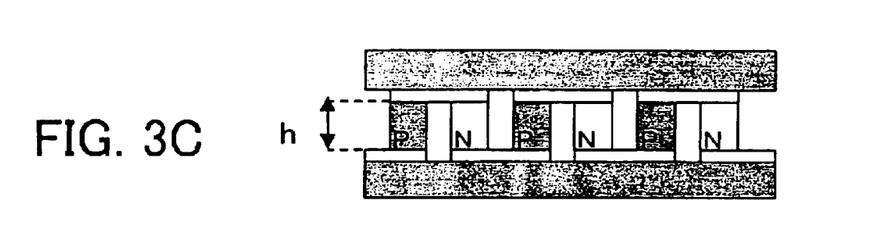

As shown in FIG. 3C, the thermoelectric cooling module is comprised of a plurality of p type and n type thermoelectric elements (peltier elements) arranged alternately, metal electrodes arranged at opposite ends of the thermoelectric elements to connect the thermoelectric elements in series, and substrates which connect to the metal electrodes, arranged to opposite to each other to sandwich the metal electrodes and thermoelectric elements, and each have an insulation thin film formed in at least part of the surface.

In FIG. 3A, substrates 12a and 12b of a thermoelectric cooling module 20 need to be insulation members to form electrode pads 14a, 14b, 15a and 15b necessary for driving the laser diode 1, thermistor 13, etc. and π junction of the peltier elements. Further, it is preferable that the substrate material has high thermal conductivity and thermal expansion coefficient that is not remarkably large. Specifically, excellent characteristics are obtained on aluminum nitride (AlN), semi-insulation silicon (Si), diamond, silicon carbide (SiC), aluminum oxide ($Al_2O_3$) and boron nitride (BN). Further, insulation is only required for a substrate surface, and it is possible to use a conductive element with the surface coated with a dielectric thin film. Particularly excellent characteristics are obtained on a copper-tungsten alloy coated with aluminum oxide ($Al_2O_3$), silicon nitride (SiNx) and silicon oxide ($SiO_2$).

A metal thin film is formed on part of the substrate 12a of the thermoelectric cooling module 20 and subjected to patterning in processes in a combination of photolithography and etching, thereby forming electrode pads 14a, 14b, 15a and 15b. In addition, in FIGS. 3A and 3B, although the thermistor 13 is mounted as another element in addition to the laser diode 1, the another element is not an essential element in the laser diode 1, and does not need to be mounted when necessary.

Further, it may be possible to mount passive components such as resistance, inductor, capacitor, and photodiode (PD), active components such as field-effect transistor (FET), bipolar transistor and optical modulator and optical components such as a lens and prism. In addition, in the case of active components, it is necessary that the total amount of generated heat meets the condition prescribed in the present invention.

In FIG. 3B, the substrate 12a of the thermoelectric cooling module 20 is a substrate on which is formed a metal pad necessary to mount an active element. It is described herein that electrode pads to mount the laser diode 1 and thermistor 13 and apply power are formed directly on the substrate 12a of the thermoelectric cooling module 20. Further, it may be possible to provide a substrate such as a laser carrier with the pads beforehand formed and the laser diode provided thereon on the thermoelectric cooling module. Generally, when a substrate larger than a substrate of the thermoelectric cooling module is provided, the size of such a substrate corresponds to the area S1 of the first thermoelectric cooling module 1 in the present invention.

In such a thermoelectric cooling module, when the substrate area is decreased due to brittleness of BiTe based material used in the thermoelectric element, limitations in assembling processes and fine structure of the thermoelectric element, increases in Joule heat in a π junction portion in the thermoelectric element, etc., characteristics drastically deteriorate due to limitations in production process and element material, and a maximum value exists in a heat absorption quantity due to dimensions of the thermoelectric element. However, in theory, even when the substrate area of the thermoelectric cooling module is decreased, the same heat absorption quantity is expected by maintaining the number of thermoelectric elements and a mode coefficient F defined as Sc/h where Sc is a junction area of the semiconductor constituting the thermoelectric elements and h is a junction interval, i.e. height of the thermoelectric elements. Therefore, when the substrate of the thermoelectric cooling module can be decreased in size without changing the mode coefficient F, it is possible to obtain a thermoelectric cooling module of a small substrate area with the equal heat absorption performance. For example, by changing a thermoelectric element conventionally of 0.5 mm square and 0.5 mm high to the element of 0.2 mm square and 0.08 mm high, a value of the mode coefficient F is not changed, and the thermoelectric cooling module is obtained which has the substrate area one-sixth that of the conventional one while having equal heat absorption performance, when the arrangement density of the thermoelectric elements described below is the same. A preferable range of the mode coefficient F is $5 \leq F \leq 25$.

The heat absorption performance of the thermoelectric cooling module varies with arrangement density Dc defined as a ratio, i.e. Sc1/Sc, of Sc1 that is the total sum of junction areas of all the thermoelectric elements joined to S1 to the substrate area S1. By decreasing intervals of the thermoelectric elements joined to the substrate to increase the arrangement density, it is possible to obtain a thermoelectric cooling module with a small substrate area while having equal heat absorption performance. However, it is difficult to decrease intervals of thermoelectric elements due to assembling process, etc., even when the size of the thermoelectric element is decreased, and there is a tendency that the arrangement density decreases when the thermoelectric element is small in size. The heat absorption performance deteriorates in such a thermoelectric cooling module. Therefore, by using a thermoelectric cooling module having thermoelectric elements each with square of 0.2 mm or less and arrangement density of 0.5 or more, the present invention is readily implemented.

Herein, Sc1 that is the total sum of the junction areas of all the thermoelectric elements joined to the substrate of the thermoelectric cooling module is dependent of the relationship with the amount of generated heat Qd of the heat generating element (herein, laser diode) disposed on the thermoelectric cooling module, and is preferably in a range of $40 \leq Qd/Sc1 \leq 500$ (mW/mm$^2$).

The relationship will be described below between the first thermoelectric cooling module and the second thermoelectric cooling module.

When it is necessary to control the temperature of a laser diode to a temperature different from the temperature of the housing by 50° C. or more like a variable wavelength laser module, it is preferable to stack thermoelectric cooling modules in stages of two or more. Further, by disposing a component such as a laser diode requiring to be cooled to near zero even when the temperature of the housing is 70° C. on the uppermost stage of the thermoelectric cooling modules constructed in stages of two or more and further disposing components such as the optical detection series 5 only requiring to be maintained at a constant temperature near room temperature on a lower stage of the thermoelectric cooling modules, it is possible to limit the substrate area of the uppermost stage, i.e. the first thermoelectric cooling module to a small value and to suppress heat inflow from the ambient gas.

In such a configuration, it is necessary for the second thermoelectric cooling module in the lower stage to absorb and discharge outside the housing the total sum of the amount of generated heat absorbed by the first thermoelectric cooling module in the upper stage on which the laser diode is disposed and the amount of generated heat generated by power that the first thermoelectric cooling module consumes. The heat that the second thermoelectric cooling module can radiate is dependent on the substrate area S2 of the second thermoelectric cooling module, and it is preferable that a ratio of the substrate area S1 of the first thermoelectric cooling module to the substrate area S2 of the second thermoelectric cooling module meets the relationship of $0.02 \leq S1/S2 \leq 0.25$.

Figure 4:
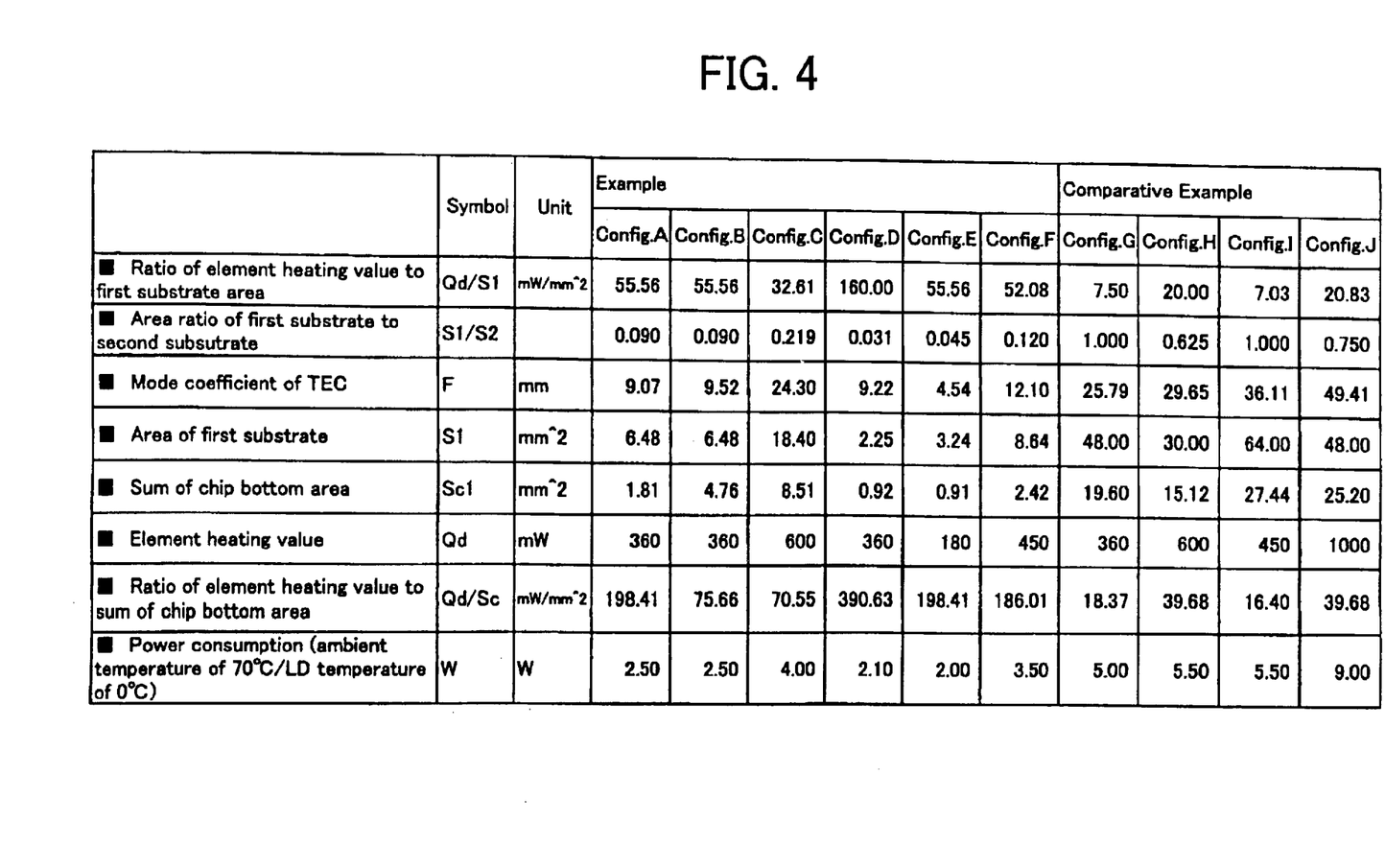
FIG. 4 is a table showing each parameter to prescribe and its power consumption.

FIG. 4 is a table showing power consumption in each temperature adjustment device comprised of the first thermoelectric cooling module and second thermoelectric cooling module when a laser module is driven so that the temperature of a laser diode is adjusted to 0° C. at ambient temperature of 70° C. with the values and configuration prescribed in the present invention, in laser modules with different Qd, S1, S2, F and Sc1 in the configuration as shown in FIG. 1, where Qd is the amount of generated heat of the laser diode, S1 is the substrate area of the first thermoelectric cooling module, S2 is the substrate area of the second thermoelectric cooling module, F is the mode coefficient of the thermoelectric element used in the first thermoelectric cooling module, and Sc1 is the total junction area of the thermoelectric elements joined to the substrate of the first thermoelectric cooling module.

Herein, used as the amount of generated heat Qd of the laser diode that is a heat generating element is a value that is estimated from a current value to apply and power consumption determined from an element resistance value of the laser diode.

Figure 5:
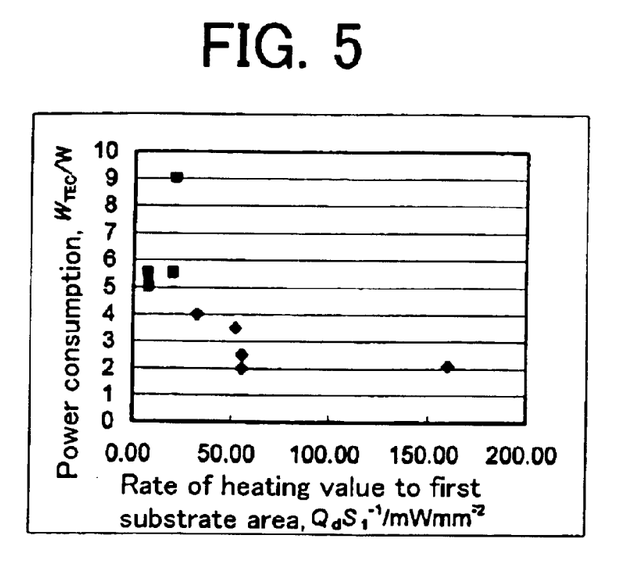
FIG. 5 is a chart showing power consumption with respect a ratio of an area of a first thermoelectric cooling module to an amount of generated heat of a heat generating element.

FIG. 5 shows the correlation between power consumption Wtec(W) and the ratio Qd/S1 of the amount of generated heat Qd(mW) of the diode to the substrate area S1(mm$^2$) of the first thermoelectric cooling module in the temperature adjustment device of the laser module with each configuration as shown in FIG. 4. Power consumption is 4 W or more in configurations such that Qd/S1 is 20 or less, while power consumption is limited to 4 W or less in temperature adjustment devices configured so that Qd/S1 meets the relationship of $20 \leq Qd/S1 \leq 200$.

Figure 6:
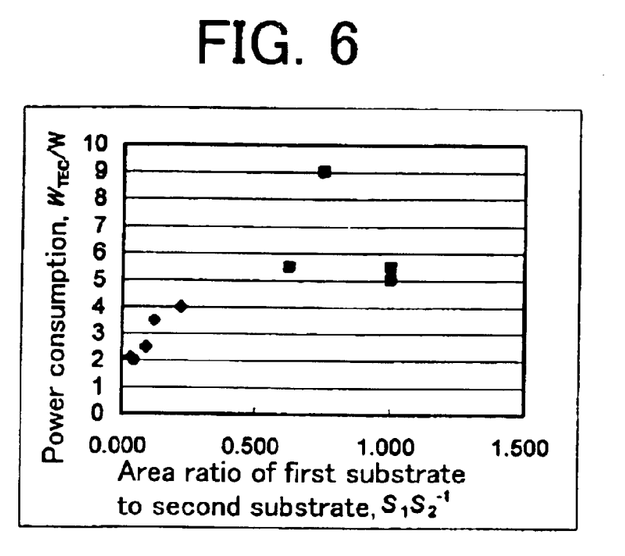
FIG. 6 is a chart showing power consumption with respect a ratio of the area of the first thermoelectric cooling module to an area of a second thermoelectric cooling module.

FIG. 6 shows the correlation between power consumption and the ratio of the substrate S1 of the first thermoplastic cooling module to the substrate area S2 on the heat dissipating side of the second thermoelectric cooling module in the temperature adjustment device of each of the configurations. The power consumption is 4 W ore more in configurations such that S1/S2 exceeds 0.25, while power consumption is limited to 4 W or less in temperature adjustment devices such that S1/S2 meets the relationship of $0.02 \leq S1/S2 \leq 0.25$.

Figure 7:
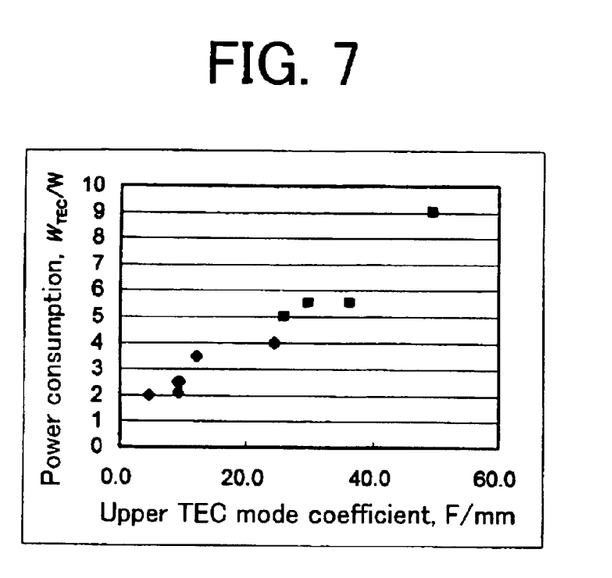
FIG. 7 is a chart showing a mode coefficient of a thermoelectric element used in the first thermoelectric cooling module and power consumption.
Figure 8:
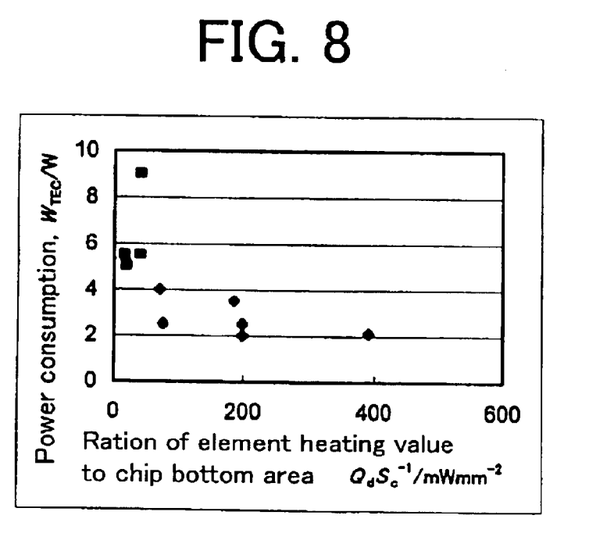
FIG. 8 is a chart showing power consumption with respect to a ratio of the area of the first thermoelectric cooling module to a joint area of thermoelectric elements.

Further, FIG. 7 shows the relationship between the power consumption and the mode coefficient F of the thermoelectric element used in the thermoelectric cooling module in each configuration. FIG. 8 shows the relationship between power consumption and a ratio of the amount of generated heat Qd to Sc1 that is the sum total of the junction areas of all the thermoelectric elements joined to the substrate S1 of the thermoelectric cooling module.

Hereinafter, examples of the laser module using the temperature adjustment device of the invention will be described below.

EXAMPLES

Example 1

Example 1 of the present invention is a wavelength variable laser module as shown in FIG. 1. As described above, the laser diode is mounted on the laser carrier composed of thermal conductive material mounted on the first thermoelectric cooling module and undergoes temperature control. The first thermoelectric cooling module is mounted on the second thermoelectric cooling module with a larger substrate area. The thermal conductive substrate is provided between the first and second thermoelectric cooling modules, and diffuses the heat dissipated from the first thermoelectric cooling module inside the substrate so as to convey the heat efficiently to the substrate of the second thermoelectric cooling module.

The wavelength detection series 5 is mounted on the third thermoelectric cooling module, and controlled to constant temperature. According to this example, the component which should be maintained at the constant temperature undergoes temperature control different from that of the laser diode requiring variable temperature. Further, the first and second thermoelectric cooling modules are configured in two stages, and cool only laser diode and its peripheral portion, thus enabling reduction in power consumption of the entire laser module.

Example 2

Figure 9:
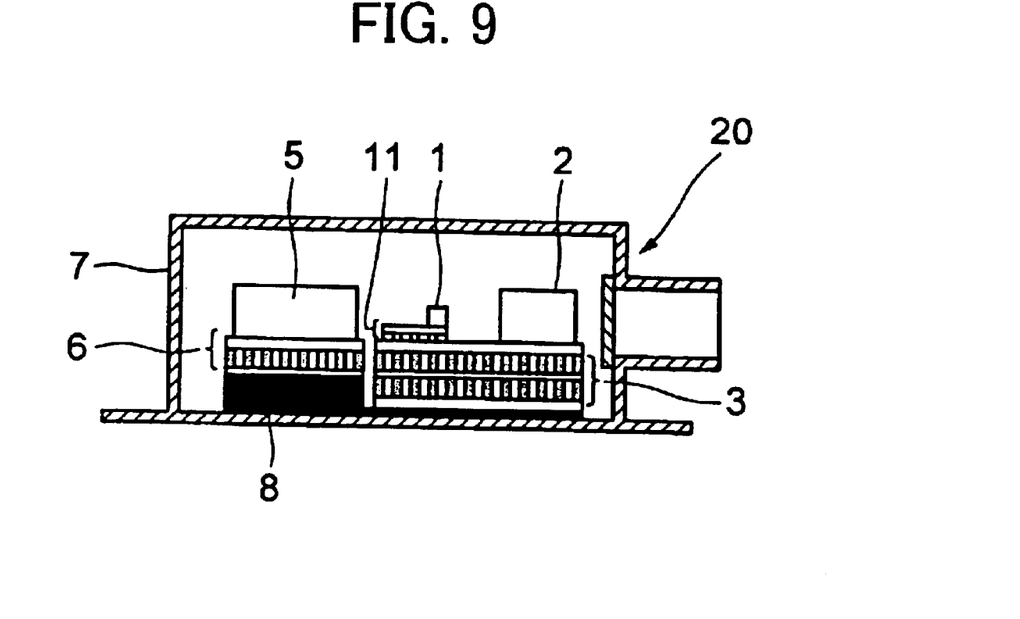
FIG. 9 is a schematic cross sectional view of a laser module according to Example 2 of the invention.

FIG. 9 is a view showing a cross section of the wavelength variable laser module of the present invention. In the wavelength variable laser module 20, in order to vary the temperature of the laser diode 1 widely, the first thermoelectric cooling module 11 on which the laser diode 1 is mounted is mounted on the second thermoelectric cooling module 3 having a configuration where two thermoelectric cooling modules are beforehand stacked.

In FIG. 9, the optical detection series 5 existing to the left side of the laser diode 1 as viewed in the figure is comprised of optical elements such as an etalon filter, prism and photodiode, and forms a kind of wavelength divider. Further, in the wavelength variable laser module 20, since a wavelength drift occurs due to variations in temperature of the etalon, the optical detection series 5 is controlled precisely in the constant temperature by the third thermoelectric cooling module 6.

The first thermoelectric cooling module 11 is designed so that a heat absorption quantity of the thermoelectric cooling module is 250 mW (temperature difference of 35° C. ) with respect to the laser diode 1 with the amount of generated heat of 150 mV. In other words, the heat absorption quantity of the thermoelectric cooling module is 1.6 times the amount of generated heat of the laser diode, and outer dimensions of the thermoelectric cooling module are 2.5 mm wide, 1.5 mm long and 1.0 mm high. Thus, the thermoelectric cooling module has small dimensions and is capable of suppressing the heat flowing from the housing.

According to this configuration, when the temperature of the laser diode 1 is lowered, since the area of a low-temperature surface of the first thermoelectric cooling module 11 is small, the heat flowing from the housing to the thermoelectric cooling module can be limited to a small quantity. Further, since the second thermoelectric cooling module is configured in two stages, it is possible to cool the first thermoelectric cooling module with less power consumption. Furthermore, since the first thermoelectric cooling module 11 is capable of varying the temperature by 35° C. alone, loads on the second thermoelectric cooling module 3 are reduced. As a result, it is made possible to limit power consumption required for varying the temperature of the laser diode 1 to 2 W or less. In this example, the second thermoelectric cooling module is configured in two stages. However, there is a case that the second cooling module in a single stage provides less power consumption depending on a variable temperature range of LD.

Example 3

Figure 10:
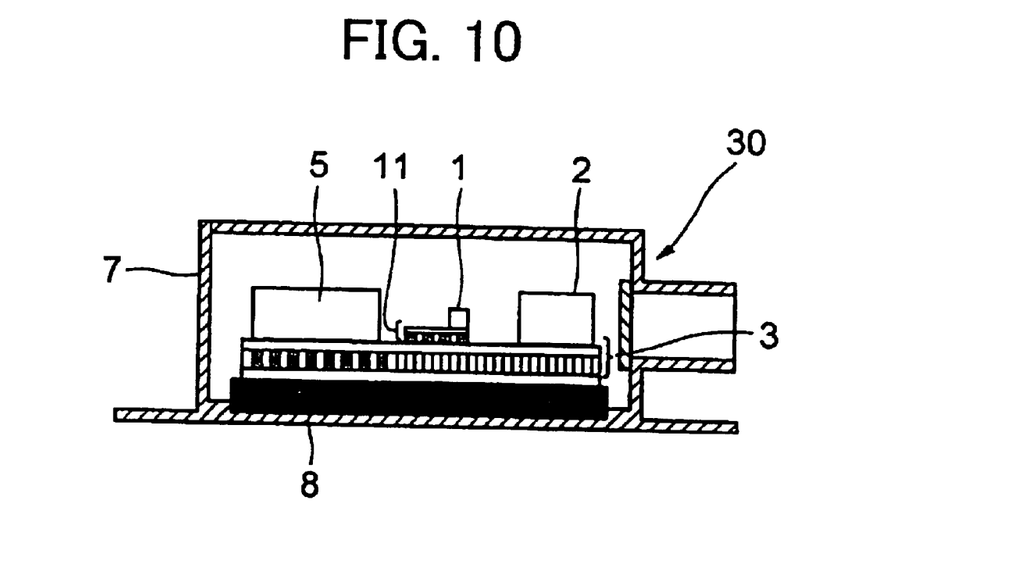
FIG. 10 is a schematic cross sectional view of a laser module according to Example 3 of the invention.

FIG. 10 is a view showing a cross section of the laser module of the present invention. The thermoelectric cooling module 11, optical system 2 and optical detection series 5 are mounted on the common second thermoelectric cooling module 3. In the fixed wavelength LD module 30, the temperature of the laser diode 1 is varied for fine adjustment of oscillation wavelength, and does not need to be varied widely. Accordingly, in a conventional fixed wavelength laser module, the laser diode is mounted on a peltier element via a chip carrier. However, in the conventional module, since the wavelength of the laser diode fluctuates, it is necessary to vary the temperature of the peltier element with a large area in a laser diode having a wavelength different from the target wavelength, leading to fluctuations in power consumption of the laser module. Further, in the conventional module, since the temperature of the optical detector varies at the same time, there is provided a low degree of flexibility in the temperature of the laser diode and temperature control of the optical detector.

As the laser module 30 of the present invention, by mounting the laser diode 1 on the second thermoelectric cooling module 3 via the first thermoelectric cooling module 11, it is possible to control the temperature of the laser diode 1 independently, and it is thus possible to overcome conventional problems such as fluctuations in power consumption of the laser module and a low degree of flexibility of temperature control. Further, since the first thermoelectric cooling module 11 has a small low-temperature surface area and the degree of flexibility in temperature control is increased, increases in power consumption hardly developed, despite of the increased number of thermoelectric cooling modules.

Moreover, in a wavelength variable laser module with a small wavelength variable range, by constructing the module in the configuration as shown in FIG. 3, it was possible to achieve low power consumption, reduction in the number of components as compared to the laser module as described in Example 2, and simplification in the control circuit of the laser module.

Example 4

In the foregoing, the wavelength variable laser module for DWDM is described which has the wavelength detection function and undergoes wavelength control. The present invention is further applicable to a laser module which does not have such a wavelength detection function. In FIG. 10, the optical detection series 5 is a photodiode to monitor an optical output. It may be possible to provide a mount directly on the bottom of the housing to mount the diode so as to reduce loads on the second thermoelectric cooling module.

In addition to the constitution of the present invention as described above, the present invention is capable of being used together with methods for reducing power consumption as described in the conventional technique. In other words, as the filling gas of the module, by using the gas with low thermal conductivity such as xenon and krypton alone or a mixture of the gases in the laser modules as described in Examples 2 to 4, power consumption was reduced. Further, there were no problems when vacuum insulation was implemented.

In the foregoing, the laser module is described for the reason of the highest effectiveness. However, the present invention is applicable to temperature adjustment of electronic devices such as FET and optical elements such as NEMS, when conditions of the temperature adjustment device of the present invention are satisfied.

As described above, implementing the present invention enables adjustment of target temperature in severe ambient temperatures with low power consumption. As an example, power consumption is reduced in half in the wavelength variable signal light source laser module used in DWDM, etc, and it is thus possible to implement densely packing. Since the entire power consumption is thus reduced, the heat exhaustion mechanism of the entire system is simplified and the DWDM system becomes compact. Further, since heat exhaustion of LD is performed effectively, a controllable temperature range of the laser element is increased. As a result, a variable range is widened of oscillation wavelength in the variable wavelength light source laser module, and it is possible to provide a low power consumption laser module enabling selection of a number of oscillation wavelengths.

According to the invention, it is possible to provide a temperature adjustment device capable of adjusting a heat generating element to a predetermined temperature in severe ambient temperatures with low power consumption and a variable wavelength light source laser module which has an increased variable range of oscillation wavelength, enables selection of a number of oscillation wavelengths, and provides low power consumption.

What is claimed is:

1. A temperature adjustment device comprising:
   a first thermoelectric cooling module;
   a second thermoelectric cooling module on which the first thermoelectric cooling module is provided; and
   a heat generating element which is provided on the first thermoelectric cooling module and a temperature thereof is adjusted;
   wherein, $20 \leq Qd/S1 \leq 200$;
   where $S1(mm^2)$ is a substrate area of the first thermoelectric cooling module on which the heat generating element is provided, and $Qd(mW)$ is an amount of generated heat of the heat generating element.

2. A temperature adjustment device comprising:
   a first thermoelectric cooling module;
   a second thermoelectric cooling module on which the first thermoelectric cooling module is provided; and
   a heat generating element which is provided on the first thermoelectric cooling module and a temperature thereof is adjusted;
   wherein, $0.02 \leq S1/S2 \leq 0.25$
   where $S1(mm^2)$ is a substrate area of the first thermoelectric cooling module on which the heat generating element is provided and $S2(mm^2)$ is a substrate area on the heat dissipating side of the second thermoelectric cooling module.

3. The temperature adjustment device according to claim 1, wherein the first thermoelectric cooling module is comprised of a plurality of thermoelectric elements and substrates arranged so as to sandwich the thermoelectric elements via an electrode; and $5 \leq F \leq 25$, where F is a mode coefficient defined as Sc/h, $Sc(mm^2)$ is an area where the thermoelectric elements are joined to one of the substrates via the electrode, and $h(mm)$ is a height of the thermoelectric elements joining the substrates.

4. The temperature adjustment device according to claim 2, wherein the first thermoelectric cooling module is comprised of a plurality of thermoelectric elements and substrates arranged so as to sandwich the thermoelectric elements via an electrode; and $$5 \leq F \leq 25,$$

where F is a mode coefficient defined as Sc/h, Sc(mm$^2$) is an area where the thermoelectric elements are joined to one of the substrates via the electrode, and h(mm) is a height of the thermoelectric elements joining the substrates.

5. The temperature adjustment device according to claim 1, wherein the amount of generated heat Qd of the heat generating element provided on the substrate is 50% or more of a heat flowing to the substrate of the first thermoelectric cooling module.

6. The temperature adjustment device according to claim 2, wherein the amount of generated heat Qd of the heat generating element provided on the substrate is 50% or more of a heat flowing to the substrate of the first thermoelectric cooling module.

7. The temperature adjustment device according to claim 3, wherein the amount of generated heat Qd of the heat generating element provided on the substrate is 50% or more of a heat flowing to the substrate of the first thermoelectric cooling module.

8. A laser module comprising:
a heat generating element;
the temperature adjustment device according to claim 1; and
a sealed housing that contains the heat generating element and the temperature adjustment device;
wherein the heat generating element is a laser diode.

9. A laser module comprising:
a heat generating element;
the temperature adjustment device according to claim 2; and
a sealed housing that contains the heat generating element and the temperature adjustment device;
wherein the heat generating element is a laser diode.

10. The temperature adjustment device according to claim 3, wherein, $$40 \leq Qd/Sc1 \leq 500 \ (mW/mm^2)$$

where Sc1 is a junction area of all the thermoelectric elements joined to the substrate of the first thermoelectric cooling module, and Qd is an amount of generated heat of the heat generating element.

* * * * *